United States Patent [19]

Kinzer

[11] Patent Number: 5,548,133
[45] Date of Patent: Aug. 20, 1996

[54] IGBT WITH INCREASED RUGGEDNESS

[75] Inventor: Daniel M. Kinzer, El Segundo, Calif.

[73] Assignee: International Rectifier Corporation, El Segundo, Calif.

[21] Appl. No.: 308,556

[22] Filed: Sep. 19, 1994

[51] Int. Cl.[6] .................. H01L 29/74; H01L 31/111; H01L 23/58

[52] U.S. Cl. .................. 257/155; 257/140; 257/146; 257/147; 257/343; 257/493

[58] Field of Search ................. 257/139, 132, 257/133, 140, 146, 147, 155, 337, 343, 492, 493

[56] References Cited

U.S. PATENT DOCUMENTS 4,980,743  12/1990  Nakagawa et al. .................. 257/155

Primary Examiner—Steven H. Loke
Attorney, Agent, or Firm—Ostrolenk, Farber, Gerb & Soffen, LLP

[57] ABSTRACT

An auxiliary MOSFET is integrated into a lateral IGBT structure with the source and drain of the auxiliary MOSFET in parallel with the emitter-base circuit of the IGBT. A driver, integrated with the IGBT chip, turns off the base emitter voltage to the IGBT before turning off the auxiliary MOSFET during turn off. The auxiliary MOSFET is turned off again at the beginning of the conduction period to ensure full conductivity modulation of the DMOS drain and maximum gain of the PNP transistor. Short circuit protection and overtemperature protection circuits are also integrated into the chip.

12 Claims, 3 Drawing Sheets

IGBT WITH INCREASED RUGGEDNESS

RELATED APPLICATIONS

This application is related to copending application Ser. No. 08/308, 655, filed Sep. 19, 1994 in the name of Daniel M. Kinzer, entitled HIGH SPEED IGBT, and is assigned to the assignee of the present invention.

BACKGROUND OF THE INVENTION

This invention relates to insulated gate bipolar transistors, and more specifically relates to a novel IGBT with improved ruggedness.

IGBTs are well known bipolar transistors which use a MOS-gate to control turn on and turn off. A typical IGBT structure is shown in copending application Ser. No. 08/041, 136, filed Mar. 30, 1993, entitled POWER TRANSISTOR DEVICE HAVING ULTRA DEEP INCREASED CONCENTRATION REGION, which application was refiled on Sep. 30, 1994, as application Ser. No. 08/316,112, and is assigned to the assignee of the present invention. IGBTs have a higher current carrying capacity than a power MOSFET of comparable chip size and a lower forward voltage drop but are subject to failure due to the inadvertent turn on of the NPN parasitic transistor defined by the usual IGBT junction pattern. Once this transistor is activated, the parasitic thyristor turns on, causing the flow of avalanche current under the collector junction and gate region and damaging or destroying the device.

The present invention provides a novel IGBT junction pattern which has higher forward current capability and which forces avalanche to occur away from the critical active region of the IGBT.

BRIEF DESCRIPTION OF THE INVENTION

In accordance with the present invention, the $P^+$ substrate of the IGBT is used to control the location of the avalanche breakdown in the device and forces avalanche to occur under the drain or collector region and removes the avalanche current from the region of the emitter region or the critical gate area. The novel invention is employed particularly with a lateral or at least partly lateral and partly vertical conduction structure.

Thus, in the present invention, a $P^+/N$ region is added into the surface of the wafer or chip of a lateral conduction IGBT at a location laterally removed from the control gate region. If the device is to break down, such breakdown occurs beneath the added $P^+$ region and away from the critical MOS-gate region.

More specifically, in accordance with the invention, an IGBT of improved ruggedness is formed of a thin wafer (or chip) of semiconductor material which has a $P^+$ substrate containing a $P^-$ body. An N type drift region is formed atop the $P^-$ body and receives at least one P type base region which contains an N type emitter region to form an invertible channel. A MOS-gate resurf structure is formed atop the invertible channel. A $P^-$ region is formed in the drift region and is laterally spaced from the P type base. A further P type collector diffusion, containing an $N^-$ type collector region is laterally spaced from the $P^-$ resurf region, to define a lateral conduction IGBT. Emitter electrodes are connected to the bottom of the chip and to the N type emitter region and P base region and a collector electrode is connected to the N type collector region and the p diffusion in which it is contained. Avalanche breakdown occurs under the P type diffusion containing the emitter region, in preference the regions adjacent to P type base region.

Other features and advantages of the present invention will become apparent from the following 10 description of the invention which refers to the accompanying drawings.

BRIEF DESCRIPTION OF THE INVENTION

DETAILED DESCRIPTION OF THE DRAWINGS

Figure 1:
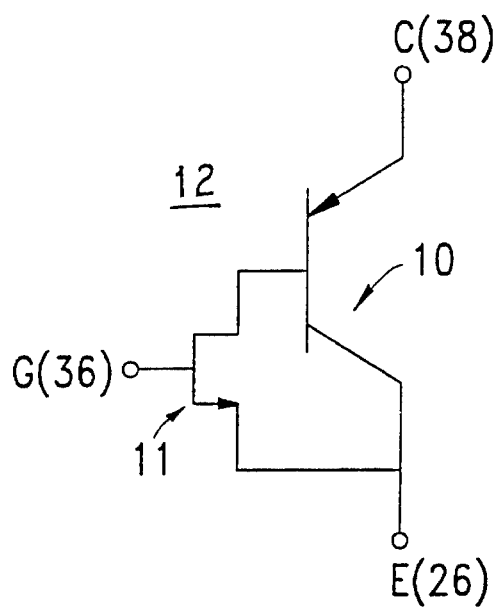
FIG. 1 shows the equivalent circuit diagram of a prior art IGBT.
Figure 2:
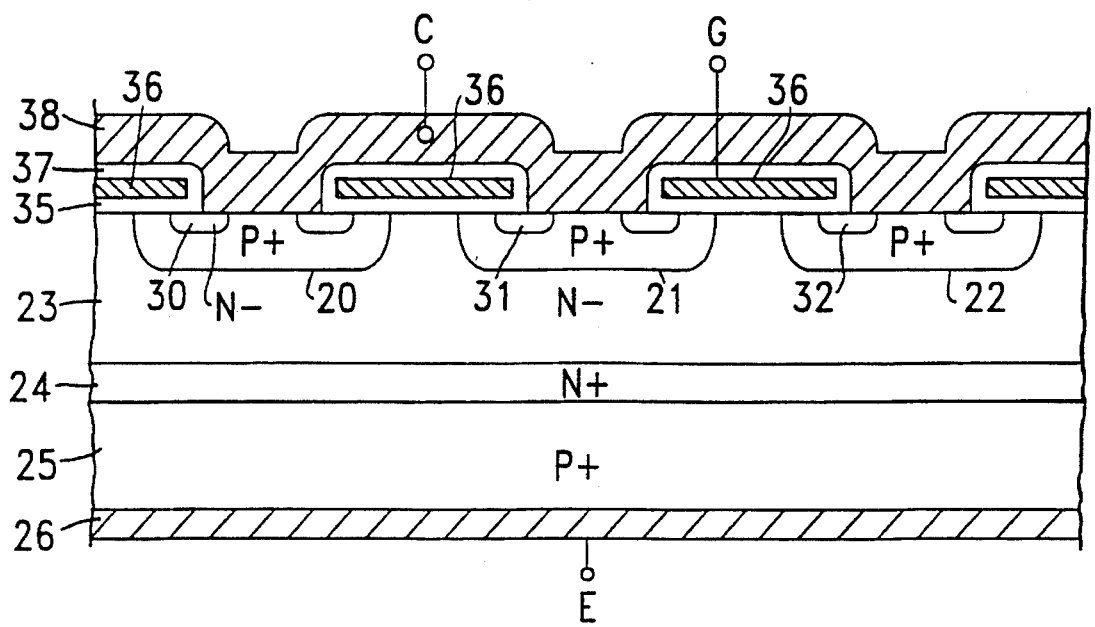
FIG. 2 is a cross-section of the junction pattern of a prior art IGBT structure.

As described in copending application Ser. No. 08/308, 655, FIGS. 1 and 2 show a prior art vertical conduction IGBT, 12 which is basically a PNP bipolar transistor 10, which has a lateral N channel MOSFET 11 to control the base of the bipolar transistor 10. FIG. 2 shows a tiny portion of the junction pattern of the IGBT transistor 12 of FIG. 1 which may have a large number of symmetrically disposed parallel P type diffusions, such as diffusions 20, 21 and 22, which are diffused into the top surface of junction-receiving epitaxially formed $N^-$ body 23. Body 23 is formed atop the thin $N^+$ buffer layer 24 which is atop the main $P^+$ chip substrate 25. An emitter electrode 26 is deposited on the bottom of substrate 25.

Each of P diffusions 20, 21 and 22 has a 10 respective annular source region 30, 31 and 32 to form annular channel regions within their respective P diffusion. These channel regions are covered by a common gate oxide lattice 35 which is, in turn, covered by a conductive polysilicon lattice 36. An interlayer oxide 37 then covers the upper surface of the chip and insulates the polysilicon gate. A collector electrode 38 covers the entire upper surface of the device and electrically contacts the center of each P type diffusion on base 20, 21 and 22 and their respective source regions 30, 31 and 32. P type diffusions 20, 21 and 22 and their sources, and the channels defined thereby, define, with the surrounding vertical common conduction region defined by adjacent diffusions, a plurality of identical cells. However, the prior art device may also be made with an interdigitated or other topology.

In operation, when a positive voltage is applied to gate electrode 36, the P type channel region of each cell inverts to connect the $N^+$ sources to the $N^-$ body, which is the base of the PNP transistors have P diffusions (emitters) 20, 23, 25. The $P^+$ regions begin to inject holes into the $N^-$ region 23 to turn on the PNP transistor over the full surface area of each cell.

To turn off the device of FIGS. 1 and 2, the gate signal to gate 36 is removed, thus removing the base drive from region 23. The injected holes in region 23 are then swept up in the usual manner and the transistor gradually turns off.

Structures such as those described for FIGS. 1 and 2 are described in more detail in copending application Ser. No. 08/041,136, which application was refiled on Sep. 30, 1994 as application Ser. No. 08/316,112 the disclosure of which is incorporated herein by reference.

In the operation of such devices, if there is avalanche breakdown, the PNP parasitic transistor will turn on and the parasitic NPNP thyristor junction turns on. This avalanche breakdown occurs in the critical active region of the device and can cause damage or destruction of the chip.

Figure 3:
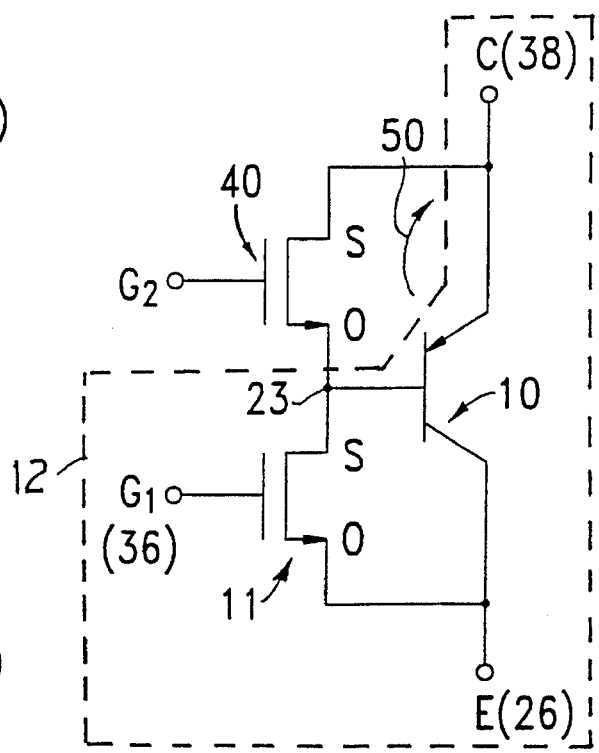
FIG. 3 is an equivalent circuit diagram of the IGBT of the present invention.

As schematically shown in FIG. 3, an additional MOSFET 40 can be added to the device of FIG. 1 to assist in more rapid turn off of the IGBT. MOSFET 40 is an N channel device having its source connected to the source regions 30, 31, 32 of cells contained in diffusions 20, 21 and 22, respectively in FIG. 2. Its drain is connected to epitaxial region 23, which is the PNP transistor base region which is flooded with minority carriers when the PNP transistor 10 is on.

In operation, the novel added transistor 40 is turned off prior to turn on of MOSFET 11 of the main IGBT 12. This turns off "Vbe" of transistor 10. To turn off the transistor 10, MOSFET 40 is turned on, thus providing a closed path 50 shown in FIG. 3 to divert electron current flow which reduces production of minority carriers (holes) in region 23, and to sweep minority carriers from region 23 into the collector (source) regions 20, 21 and 22 of FIG. 2. MOSFET 11 then turns off at a higher speed than prior art IGBTs because a large percentage of the minority carriers have been swept out of region 23, around path 50.

Figure 4:
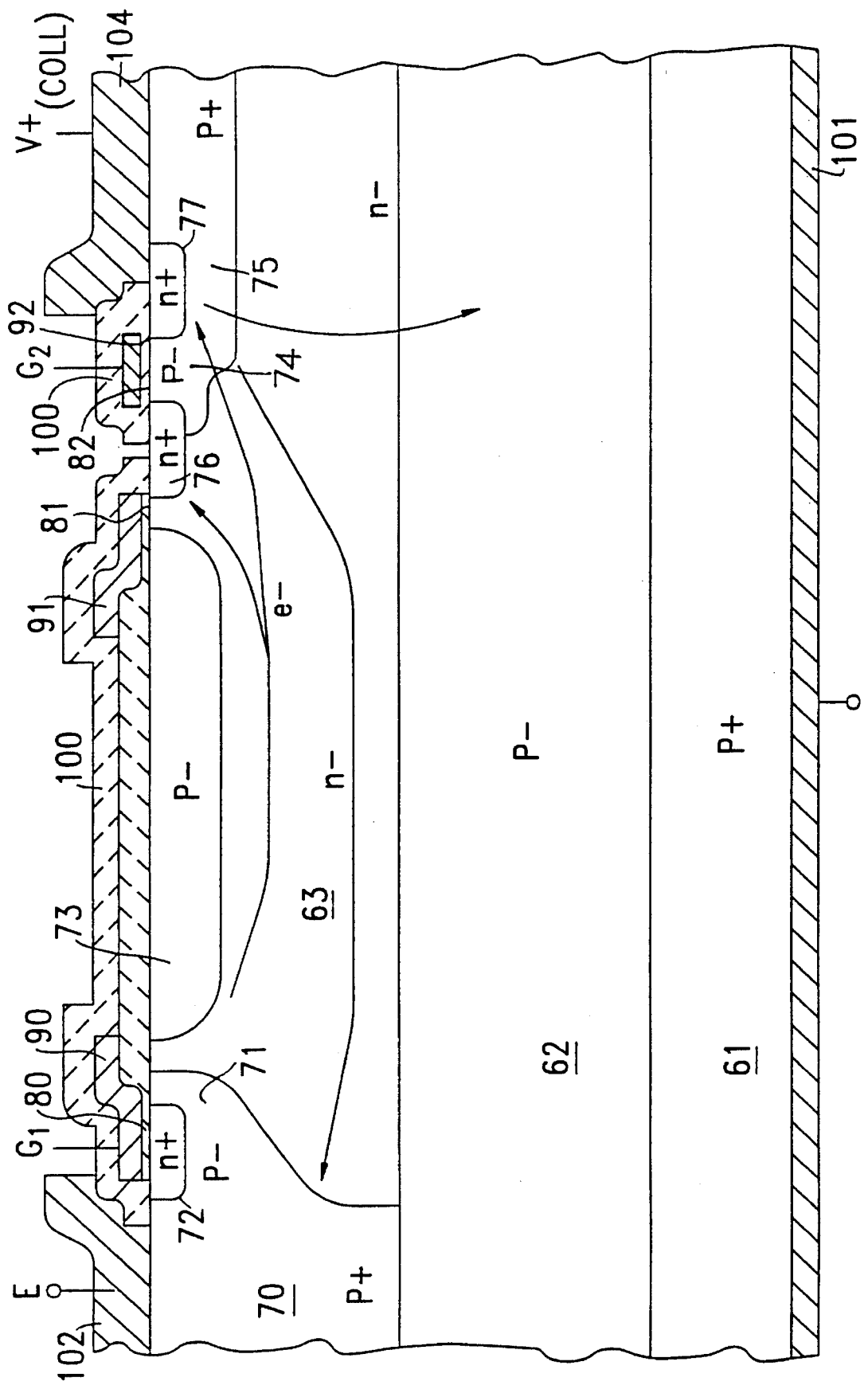
FIG. 4 is a cross-section of one possible junction pattern for the IGBT structure of the present invention.

FIG. 4 shows the manner in which the circuit of FIG. 3 can be implemented in silicon, in a combined lateral and vertical conduction device which incorporates the improvement of the present invention. More specifically, the device structure consists of a silicon chip, a small element of which is shown in cross section in FIG. 4. The chip has a P$^+$ body or substrate 61 and an epitaxially grown P$^-$ region or body 62 thereon. For a 600 volt device, the P$^-$ region is about 40 microns thick. An N$^-$ epitaxial drift region 63 is grown atop region 62 to a thickness of about 20 microns.

The main IGBT of the device is formed by parallel interdigitated strips, but can have any other desired geometry such as a serpentine geometry.

Thus, a P$^+$ diffusion 70, which is an elongated strip into the paper, extends into and through N$^-$ region 63 and to the P$^-$ body 62. A shallow, P$^-$ concentration diffusion or base region 71 blends into diffusion 70 and extends from the chip upper surface. An N$^+$ source strip or emitter diffusion 72 is formed in the combined body 70–71 as shown.

A P$^-$ diffusion 73 and a shallow P$^-$ diffusion region 74 are also formed with region 71. In accordance with the present invention, these diffusions may have a concentration corresponding to 1×10$^{-12}$ ohms per cm$^2$. P$^+$ collector diffusion 75 is preferably formed before P$^-$ regions 71, 73 and 74. N$^+$ strips 76 and 77 (a collector diffusion), which are the source and drain regions of the auxiliary MOSFET 40 of FIG. 3, are formed during the formation of source 72.

As will be later seen, region 75 causes the removal of avalanche breakdown from the critical gate area of the device, to be described, and to position under region 75. Thus, gate oxide layers 80 and 81 are formed over the P$^-$ channel region 71 and over the N$^-$ region between P$^-$ strip 73 and N$^+$ region 76. A further gate oxide layer 82 is disposed over the P$^-$ region between N$^+$ strips 76 and 77. Polysilicon electrodes 90 and 91, which are connected together to define gate G$_1$ of the IGBT of FIG. 3 are formed over gate oxide layers 80 and 81. Polysilicon electrode 92 overlies oxide 82 and is gate G$_2$ for the auxiliary MOSFET 40. An interlayer oxide 100 overlies the polysilicon gate electrodes 90, 91 and 92.

The emitter electrode 101 for the device, which can also be termed the power ground, is formed on the bottom of chip 60. A second emitter or power ground 102 for the IGBT contacts the P$^+$ region and source 72 on top of the chip. The collector electrode 104 or "V$^+$" electrode contacts P$^+$ region 75 and N$^+$ region 77.

The device as disclosed in FIG. 4 is an IGBT which has both vertical and lateral conduction paths but has the control MOSFET 40 integrated therein. Thus, to turn on the IGBT, polysilicon gates 90–91 invert the regions under gate oxide layers 80 and 81, turning on the lateral MOSFET 11 (FIG. 3) consisting of P region 70–71, N$^-$ region 63 and P$^+$ region 75 to permit turn on and conduction between electrodes 102 and 104. That is, P$^+$ region 75 will inject holes h$^+$ laterally through region 63 and an electron current e$^-$ will flow in the opposite lateral direction. At the same time, holes h$^+$ will be injected from P$^+$ region 75 vertically downward to electrode 101 and an electron current e$^-$ will flow in the reverse direction.

Significantly, and in accordance with the present invention, the presence of the P$^+$ region 75 will force early avalanche breakdown under P$^+$ region 75 and away from the emitter terminal 102, thus reducing the chance of sufficient avalanche current flow under source 72 to turn on the parasitic NPN transistor 72, 71, 63.

In order to speed up the operation of the IGBT, and as described in copending application Ser. No. 08/308,655, the auxiliary MOSFET 40, consisting of regions 76, 77 and 74, is turned on just before turn off of the IGBT to reduce hole injection before turn off. Thus, while the IGBT is conducting, G$_1$ is high and G$_2$ is low. Just before turn off, G$_2$ is made high. This stops hole injection from region 75 just before turn off to reduce the population of holes in region 63. Gate G$_1$ is then turned low or off and the IGBT turns off at relatively high speed (compared to a conventional IGBT) in view of the smaller number of minority carriers in region 63.

It should be noted that the P$^+$ region or collector diffusion 75 serves a number of functions. First, it permits the flow of vertical current, thus reducing forward voltage drop. Second, and in accordance with the invention, it limits the thickness needed for P$^-$ region 62 and the number of holes which must be swept out to speed up the device. P$^+$ region 75 also forces avalanche under the collector and away from the emitter terminal 102, thus reducing the chance of activating the NPN parasitic transistor.

Figure 5:
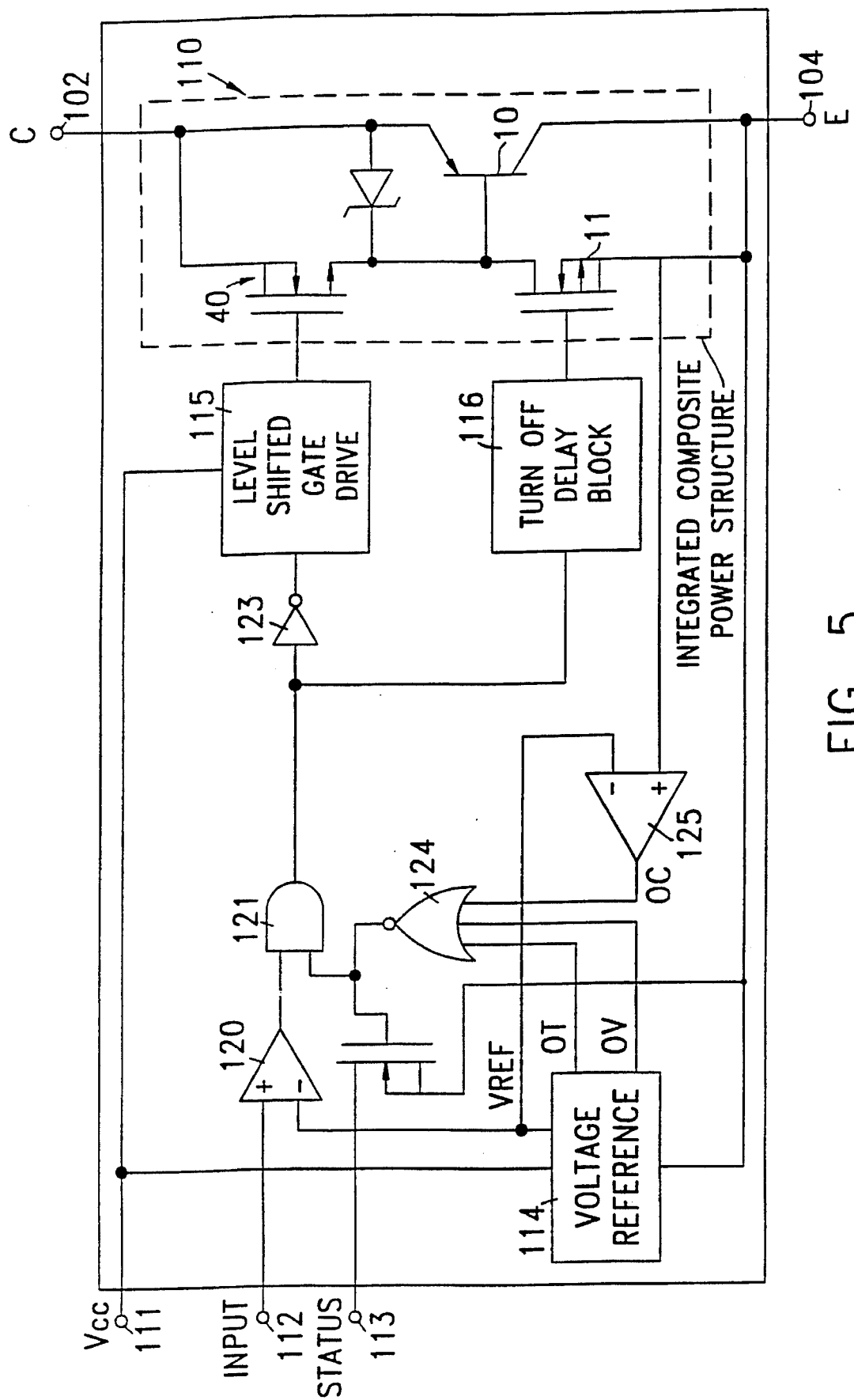
FIG. 5 is a schematic diagram of an integrated circuit/chip which integrates control functions with the IGBT of FIGS. 3 and 4.

FIG. 5 is a block diagram of the novel device of the invention, with control circuits integrated into the same silicon. Thus, the main device, as described in FIGS. 3 and 4, is the composite power structure 110 having collector and emitter electrode pins 38 and 26, respectively. The composite contains PNP transistor 10 and MOSFETs 11 and 40 of FIG. 3. V$_{cc}$, input and status pins 111, 112 and 113 are also added, where the device is mounted in a 5 pin, T0220 type package. The other control circuit components are a voltage reference circuit 114, a level shift gate drive circuit 115 for MOSFET 40, and a turn-off delay circuit 116 to MOSFET 11, which allows MOSFET 40 to turn on before MOSFET 11 turns off. Other control circuits 120, 121, 123, 124, 125 are provided which control and monitor chip overtemperature ("OT") and turn off the device 110 if the chip temperature exceeds a given value, and to monitor chip overcurrent ("OC") to turn off the chip if the collector current exceeds a given value. Note that the power device 110 will not interfere with the control functions since there is no back junction which can inject minority carriers into the control structure.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An insulated gate bipolar transistor (IGBT) having improved ruggedness comprising a thin wafer of semiconductor material; said wafer having a $P^+$ substrate extending to a first surface of said wafer and a $P^-$ body formed atop said $P^+$ substrate and extending to a second surface of said wafer; at least one P type base region diffused into said $P^-$ body and an N type emitter diffusion region formed in said P type base region and defining a first invertible channel region in said P type base region; a first MOS-gate structure disposed atop said first invertible channel region for controllably inverting said channel region to turn said IGBT on; an $N^-$ drift region diffused into the surface of said $P^-$ body and extending from said P type base region; a relatively thick $P^-$ resurf diffusion region formed into and contained within said $N^-$ drift region; a P type collector diffusion formed in said $N^-$ drift region at a location laterally spaced from said $P^-$ resurf diffusion region an $N^+$ collector diffusion region formed in said P type collector diffusion region and defining a second invertible channel region in said P type collector diffusion region between said $N^+$ collector diffusion region and said $N^-$ drift region; a second MOS-gate structure disposed above said second invertible channel for controllably inverting said second channel region; a first emitter contact connected to said P type base region; and a collector contact connected to said P type collector diffusion region and said $N^+$ collector diffusion region.

2. The device of claim 1, wherein avalanche breakdown occurs preferentially from said P type collector diffusion region to prevent avalanche breakdown from said P type base region.

3. The device of claim 2, wherein said first and second surfaces are the opposite surfaces of said wafer.

4. The device of claim 3, which includes a second emitter contact on said first surface.

5. The device of claim 2, which includes a second emitter contact on said first surface.

6. The device of claim 1, wherein said first and second surfaces are the opposite surfaces of said wafer.

7. The device of claim 1, which includes a second emitter contact on said first surface.

8. The device of claim 1, wherein said $P^-$ resurf diffusion region has a concentration corresponding to $1\times10^{-12}$ ohms per $cm^2$.

9. An integrated circuit chip comprising a thin wafer of semiconductor material; said wafer including:

an insulated gate bipolar transistor (IGBT) having improved ruggedness and comprising a $P^+$ substrate extending to a first surface of said wafer and a $P^-$ body formed atop said $P^+$ substrate and extending to a second surface of said wafer, at least one P type base region diffused into said $P^-$ body and an N type emitter diffusion region formed in said P type base region and defining a first invertible channel region in said P type base region, a first MOS-gate structure disposed atop said first invertible channel region for controllably inverting said channel region to turn said IGBT on, an $N^-$ drift region diffused into the surface of said $P^-$ body and extending from said P type base region, a relatively thick $P^-$ resurf diffusion region formed into and contained within said $N^-$ drift region, a P type collector diffusion region formed in said $N^-$ drift region at a location laterally spaced from said $P^-$ resurf diffusion region, an $N^+$ collector diffusion region formed in said P type collector diffusion region and defining a second invertible channel region in said P type collector diffusion region between said $N^+$ collector diffusion region and said $N^-$ drift region, and a second MOS-gate structure disposed above said second invertible channel for controllably inverting said second channel region, a first emitter contact connected to said P type base region, and a collector contact connected to said P type collector diffusion region and said $N^+$ collector diffusion; and a level shift gate drive circuit for driving said second MOS-gate structure.

10. The integrated circuit chip of claim 9, wherein said wafer includes a turn-off delay circuit for permitting said second MOS-gate structure to turn on before said first MOS-gate structure turns off.

11. The integrated circuit chip of claim 9, wherein avalanche breakdown occurs preferentially from said P type collector diffusion to region to prevent avalanche breakdown from said P type base region.

12. The integrated circuit chip of claim 9, wherein said $P^-$ resurf diffusion region has a concentration corresponding to $1\times10^{-12}$ ohms per $cm^2$.

* * * * *